United States Patent [19]

Sigmon

[11] Patent Number: 5,027,086

[45] Date of Patent: Jun. 25, 1991

[54] DIELECTRIC RESONATOR OSCILLATOR POWER COMBINER

[75] Inventor: Bernard E. Sigmon, Tempe, Ariz.

[73] Assignee: Motorola, Inc., Schaumburg, Ill.

[21] Appl. No.: 532,425

[22] Filed: Jun. 4, 1990

[51] Int. Cl.$^5$ ............................................. H03B 7/14
[52] U.S. Cl. ............................ 331/99; 331/107 DP; 331/107 P; 331/107 SL
[58] Field of Search ............... 331/56, 74, 96, 99, 331/107 DP, 107 P, 107 SL, 117 D

[56] References Cited

U.S. PATENT DOCUMENTS

| | | | |
|---|---|---|---|
| 3,659,222 | 4/1972 | Assour et al. | 331/107 SL X |
| 3,721,918 | 3/1973 | Rosen et al. | 331/107 SL X |
| 3,868,594 | 2/1975 | Cornwell et al. | 331/107 SL X |
| 4,005,372 | 1/1977 | Ho et al. | 331/107 SL X |
| 4,185,252 | 1/1980 | Gerlach | 331/107 P X |
| 4,480,233 | 10/1984 | Juul | 331/107 P X |
| 4,514,707 | 3/1985 | Dydyk et al. | 331/107 SL |
| 4,763,085 | 8/1988 | Lamberg | 331/107 P X |

*Primary Examiner*—David Mis
*Attorney, Agent, or Firm*—Frank J. Bogacz; Jordan C. Powell

[57] ABSTRACT

A microwave oscillator/power combiner incorporates two microstrip transmission lines, each coupled electromagnetically to an output transmission line. Each of the microstrip transmission lines incorporate active diodes such as IMPATT or GUNN diodes which generate RF energy when acted upon by a DC voltage. The output transmission line is coupled to ground to allow the output end of the transmission line to be adjacent to the active diodes. The two microstrip transmission lines are coupled to a high Q tank circuit through a Wilkinson power divider. The high Q tank circuit is preferably a dielectric resonator. The oscillator may be cascaded to increase power output.

13 Claims, 3 Drawing Sheets

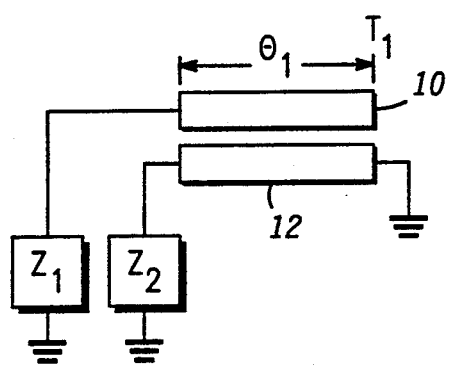
*FIG. 1*
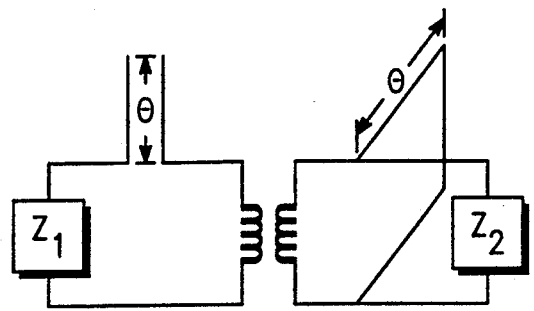
*FIG. 2*
*FIG. 3*
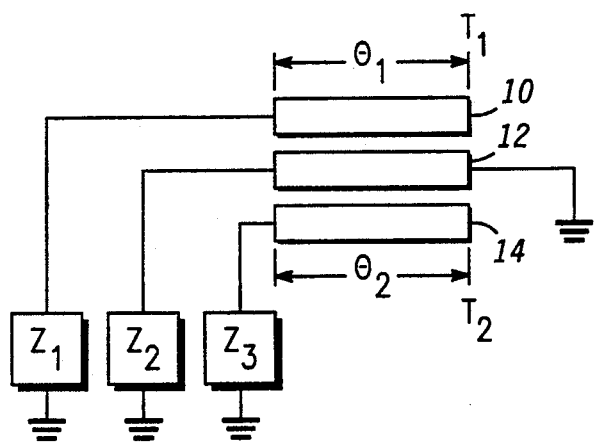
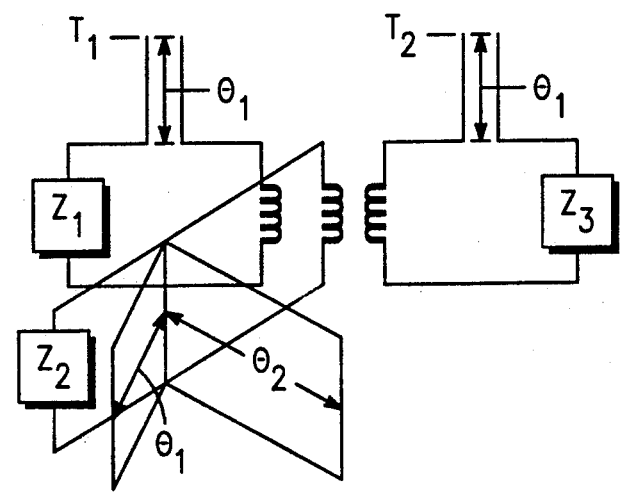
*FIG. 4*

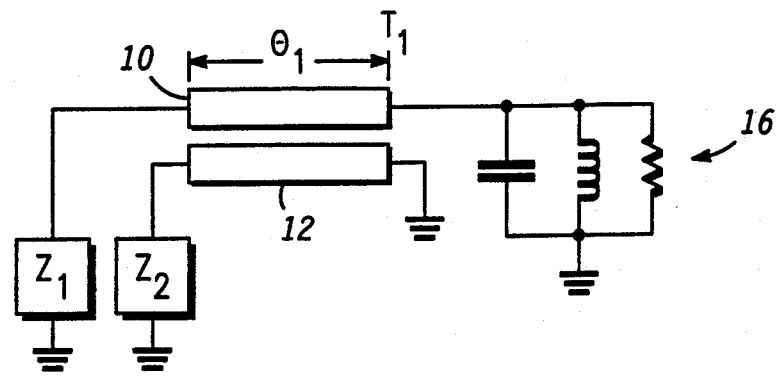
FIG. 5
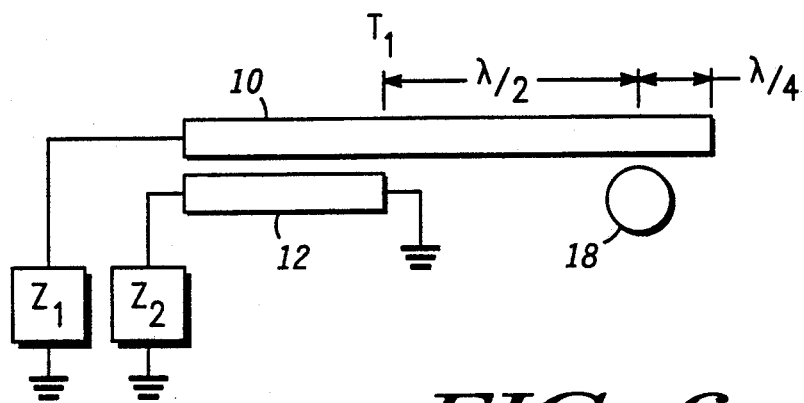
FIG. 6
FIG. 7
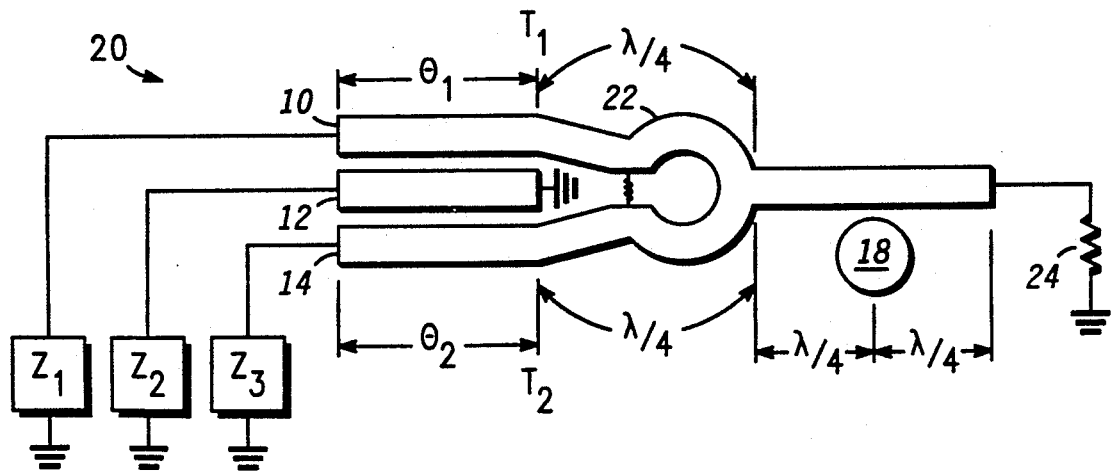

DIELECTRIC RESONATOR OSCILLATOR POWER COMBINER

BACKGROUND OF THE INVENTION

This invention relates, in general, to high power solid state sources, and more specifically, to high power dielectric oscillators.

Conventional sources using dielectric stabilized oscillators (for frequency stability) invariably require power combiner/amplifier stages to achieve the necessary power needed for each application. For example, a typical dielectric resonator oscillator would output approximately 20 or 30 milliwatts and require two or three stages of amplification to achieve a power output of 20 to 30 watts. In addition, an RF driver stage and a power combiner must be added to the amplifiers to complete the circuit. One such dielectric oscillator which outputs relatively large power is disclosed in U.S. application Ser. No. 430,035 by the same inventor as the present application and assigned to the same assignee.

This type of oscillator having stages of amplifiers and power combiners requires circulators or isolators between stages to prevent deleterious interactions between stages. For instance, isolators would separate the oscillator from the amplifiers, and similarly, separate the amplifiers from each other.

As the different elements are combined, the entire circuit becomes relatively large. Accordingly, the size and volume increase. If the power must be increased, additional stages must be cascaded onto the entire circuit. This cascading effect decreases the total DC to RF conversion efficiency as each additional stage is cascaded on. Applications for dielectric oscillators, particularly in the microwave frequencies, continually require smaller physical volumes with larger power outputs.

SUMMARY OF THE INVENTION

Accordingly, it is an object of the present invention to provide a high power, high Q dielectric oscillator and power combiner which is realized in a single, compact stage.

A microwave oscillator/power combiner incorporates two microstrip transmission lines, each coupled electromagnetically to an output transmission line. Each of the microstrip transmission lines incorporate active diodes such as IMPATT or GUNN diodes which generate RF energy when acted upon by a DC voltage. The output transmission line is coupled to ground to allow the output end of the transmission line to be adjacent to the active diodes. The two microstrip transmission lines are coupled to a high Q tank circuit through a Wilkinson power divider. The high Q tank circuit is preferably a dielectric resonator. The oscillator may be cascaded to increase power output.

The above and other objects, features, and advantages of the present invention will be better understood from the following detailed description taken in conjunction with the accompanying drawings.

BRIEF DESCRIPTION OF THE DRAWING

FIG. 1 is a diagram of an improved high power microwave oscillator according to the present invention.

FIG. 2 is a diagram of the equivalent circuit of FIG. 1.

FIG. 3 is a diagram of a high power microwave oscillator/combiner according to the present invention.

FIG. 4 is a diagram of the equivalent of circuit of FIG. 3.

FIG. 5 is a diagram of the high power oscillator of FIG. 1 having a high Q tank circuit to increase the Q of the circuit of FIG. 1.

FIG. 6 is a diagram of the oscillator of FIg. 5 with a dielectric resonator replacing the generic high Q tank circuit.

FIg. 7 is a diagram of a high Q high power microwave oscillator/combiner according to the present invention.

DETAILED DESCRIPTION OF THE INVENTION

Figure 8:
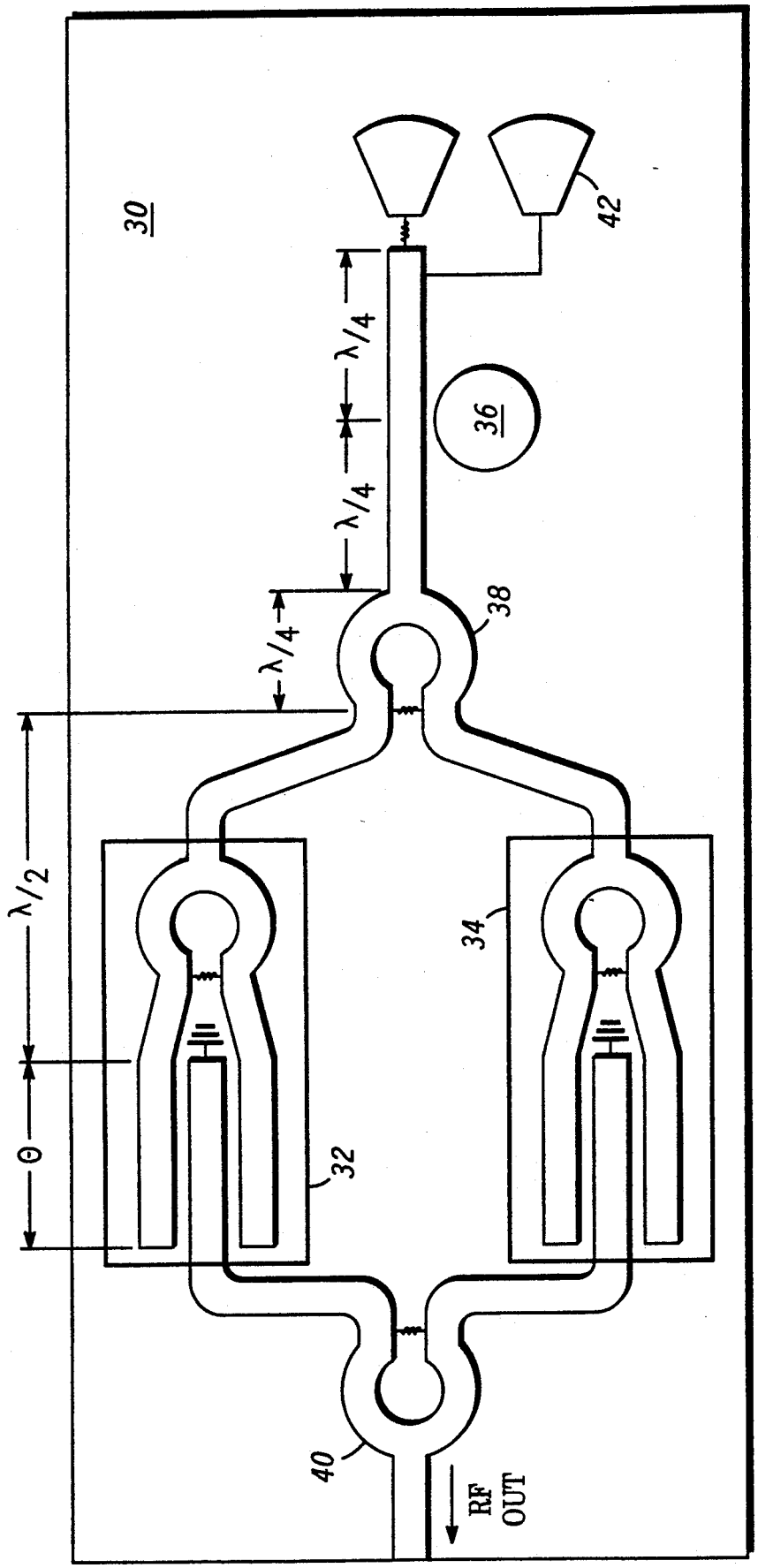
FIG. 8 is a diagram of the circuit of FIg. 7 cascaded to increase power output.

The teachings of U.S. Pat. No. 4,982,168 are hereby incorporated by reference.

FIG. 1 shows the topology of two parallel microstrip lines, 10 and 12, coupled together in a microwave system. Each microstrip line has a complex load represented by $Z_1$ and $Z_2$ respectively. Microstrip line 12 is coupled to ground on a side opposite that of complex load $Z_2$. The importance of this coupling to ground will be explained later.

Microstrip line 10 has a terminal plane $T_1$ which represents an open circuit at point $T_1$. A load at this point approaches infinite impedance.

Microstrip lines 10 and 12 have electrical equivalent lengths of $\theta_1$ where:

$$\theta = \left(\frac{2\pi}{\lambda}\right)X = \beta X$$

X = length of the microstrip line
$\lambda$ = wave length, and
$\beta$ = a constant.

FIG. 2 shows the circuit of FIG. 1 in a quasi-lumped equivalent circuit. As shown in FIG. 2, if $Z_1$ is an active device, such as a GUNN diode or IMPATT diode, and $Z_2$ is an RF load to which microstrip line 12 is coupled, an oscillator is realized. The oscillator of FIG. 2 is a low Q oscillator subject to drift.

One skilled in the art will recognize that GUNN and IMPATT diodes are negative resistance devices and generate energy when subjected to a DC voltage.

Without the ground coupled to microstrip line 12, load $Z_2$ would need to be coupled to the opposite end of microstrip line 12. Specifically, without the ground, $Z_2$ cannot be adjacent to active load $Z_1$, but must rather be opposite thereto. The coupling of microstrip line 12 to ground, and therefore placing load $Z_2$ adjacent to active load $Z_1$, allows the oscillator formed by microstrip lines 10 and 12 to be coupled with other microstrip lines in power combiner form to generate the high power oscillator/power combiner of the present invention.

FIG. 3 shows the oscillator formed by microstrip lines 10 and 12 coupled to a third microstrip line 14. Microstrip line 14 is coupled to a load $Z_3$ which, when represented as an active load, interacts with microstrip line 12 to realize a second oscillator. Since microstrip lines 10 and 12 form an oscillator, and microstrip lines 12 and 14 form an oscillator, both of which output power through microstrip line 12, microstrip line 12 further acts as a power combiner. The power of both oscillators are output through RF load $Z_2$.

One will recognize that, as with microstrip line 10, microstrip line 14 requires terminal plane $T_2$ where any load impedance approaches infinity. Furthermore, microstrip line 14 has electrical length $\theta_2$.

FIG. 4 shows the equivalent semi-lumped element circuit of FIG. 3. The oscillator function and power combination become more apparent in FIG. 4.

Referring now to FIG. 5, the microstrip oscillator of FIG. 1 is shown having a high Q tank circuit 16. When high Q tank circuit 16 is coupled to the terminal plane $T_1$, the oscillator formed by microstrip lines 10 and 12 oscillates with a Q and stability strongly influenced by the parameters of high Q tank circuit 16. For instance, if high Q tank circuit is temperature stable, the oscillator will also be temperature stable.

FIG. 6 shows the oscillator of FIG. 5 where high Q tank circuit 16 has been substituted with a dielectric resonator 18. Dielectric resonator 18 is placed one-half wave length from terminal plane $T_1$. The high impedance resonance of dielectric resonator 18 will repeat along a transmission line every one-half wave length. Therefore, dielectric resonator 18 must be placed at intervals of one-half wave length from terminal plane $T_1$.

Microstrip line 10, as shown in FIG. 6, continues one-quarter wave length past dielectric resonator 18. One skilled in the art of microwave transmission theory will recognize that the magnetic coupling potential is strongest where the electric potential is the weakest. This point occurs one-quarter wave length from an open. Since the end of microstrip line 10 is an open, dielectric resonator 18 is coupled to the strongest at the point of high magnetic coupling potential. Therefore, dielectric resonator 18 is positioned adjacent to, and one-quarter wave length from the end of, microstrip line 10.

It should be noted that the oscillator of FIG. 6 is similar to the high power oscillator disclosed in U.S. Pat, No. 4,982,168 referenced previously. However, unlike the invention of U.S. Pat. No. 4,982,168 microstrip line 12 is coupled to ground. This allows the RF coupling of $Z_2$ to be adjacent to the active load $Z_1$. The importance of this coupling is seen in FIG. 7.

FIG. 7 shows a high Q oscillator/power combiner 20 (hereafter circuit 20) in its preferred embodiment. Circuit 20 combines the high Q oscillator of FIG. 6 with the oscillator/power combiner of FIG. 3 by using a Wilkinson power divider 22. The importance of the ground coupling of microstrip line 12, and therefore the reverse location of the RF load $Z_2$, is evidenced by the location of Wilkinson power divider 22. The reversing of the location of RF load $Z_2$ allows Wilkinson divider 22 to couple microstrip lines 10 and 14 together to dielectric resonator 18.

FIG. 7 shows that the distance from terminal planes $T_1$ and $T_2$ to the opposite end of Wilkinson divider 22 is one-quarter wave length. Similarly, the distance from Wilkinson divider 22 to dielectric resonator 18 is one-quarter wave length. Together, the distances give the necessary one-half wave length from dielectric resonator 18 to the terminal planes.

The operation of stabilizer resistor 24 is discussed in U.S. Pat. No. 4,982,168 referenced above.

Circuit 20 of FIg. 7 has been shown through testing to output approximately 15 watts at 16 Gigahertz and 40 watts at 9.5 Gigahertz.

FIG. 8 shows an additional embodiment when greater power is required, or when the oscillator must operate at higher frequencies. The high power oscillator 30 of FIG. 8 incorporates two oscillator/combiners 32 and 34 coupled to dielectric resonator 36 through Wilkinson power divider 38. The outputs of oscillator/combiners 32 and 34 are combined by Wilkinson power combiner 40 and output.

Each of oscillator/combiners 32 and 34 have two microstrip lines coupled to a Wilkinson power divider, and have active elements, such as GUNN and IMPATT diodes coupled opposite to the Wilkinson power divider. A third microstrip is electromagnetically coupled to the first two microstrip lines and coupled to Wilkinson power combiner 40. Oscillator/combiners 32 and 34 are similar to circuit 20 of FIG. 7.

DC bias terminal 42 supplies the DC voltage necessary to activate the active diodes in oscillator/combiners 32 and 34.

By coupling oscillator/combiners 32 and 34 together, the power output by circuit 20 of FIG. 7 can be doubled. The dielectric resonator can be used for both oscillator/combiners 32 and 34. Furthermore, additional oscillator/combiners can be cascaded to increase the power output of the entire circuit. There will be some decrease in Q as additional oscillator/combiners are cascaded on. However, the decrease in Q will be insignificant in almost all applications of the circuit.

By coupling a dielectric resonator to two oscillators having a common output microstrip line using a Wilkinson power divider, the size and volume of the entire oscillator/amplifier circuitry can be substantially decreased. Additional power requirements can be easily facilitated in a very small area without adding the number of proportionally large devices such as amplifiers.

Thus there has been provided, in accordance with the present invention, a high power microstrip oscillator/power combiner that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. An oscillator comprising:
   first oscillating means for generating a first temperature stable resonant frequency from an input bias;
   a first high power means for receiving said first resonant frequency to generate a first resonating high impedance, said first high power means inverting said first resonating high impedance to output a first high power oscillating signal;
   said first high power means coupled to an electric ground;
   said first high power means electromagnetically coupled to said first oscillating means;
   second oscillating means for generating a second temperature stable resonant frequency from said input bias; and
   said first high power means electromagnetically coupled to said second oscillating means to receive said second temperature stable resonant frequency.

2. An oscillator according to claim 1 wherein said first oscillating means comprises:

resonator means for generating a resonating frequency from said input bias;

temperature stabilizing means for stabilizing said resonating frequency at a predetermined frequency;

said temperature stabilizing means coupled to said resonator means; and said resonator means producing said temperature stable resonant frequency.

3. An oscillator according to claim 2 wherein said resonator means comprises:

an active diode, said active diode receiving said bias and generating a resonating current;

a transmission line coupled to said active diode; and said transmission line further coupled to said temperature stabilizing means.

4. An oscillator according to claim 2 wherein said temperature stabilizing means comprises:

a transmission line coupled to said resonator means; and a dielectric resonator electromagnetically coupled to said transmission line one-half wave length from said resonator means.

5. An oscillator according to claim 1 wherein said first and second oscillating means each comprise:

resonator means for generating a resonating frequency from said input bias; and said resonator means producing said temperature stable resonant frequency.

6. An oscillator according to claim 1 further comprising:

a first power divider coupled to said first and second oscillating means; and said first power divider splitting a signal received by said first power divider between said first and second oscillating means.

7. An oscillator according to claim 6 further comprising:

temperature stabilizing means for stabilizing said first and second temperature stable resonant frequencies at a predetermined frequency; and said temperature means coupled to said power divider to supply said signal received by said power divider.

8. An oscillator according to claim 7 wherein said temperature stabilizing means comprises:

a transmission line coupled to said power divider; and a dielectric resonator electromagnetically coupled to said transmission line one-half wave length from said first and second oscillating means.

9. An oscillator according to claim 6 further comprising:

third and fourth oscillating means for respectively generating third and fourth temperature stable resonant frequencies from said input bias;

second high power means for receiving said third and fourth resonant frequencies to generate a second resonating high impedance, said second high power means inverting said second resonating high impedance to output a second high power oscillating signal;

said second high power means coupled to an electric ground;

said second high power means electromagnetically coupled to said third and fourth oscillating means a second power divider coupled to said third and fourth oscillating means;

said second power divider splitting a signal received by said second power divider between said third and fourth oscillating means.

10. An oscillator according to claim 9 further comprising:

third power divider coupled to said first and second power dividers;

temperature stabilizing means for stabilizing said first, second, third, and fourth temperature stable resonant frequencies at a predetermined frequency; and said temperature means coupled to said third power divider to supply said signal received by said first and second power dividers.

11. An oscillator according to claim 10 wherein said temperature stabilizing means comprises:

a transmission line coupled to said third power divider; and a dielectric resonator electromagnetically coupled to said transmission line one wave length from said first, second, third, and fourth oscillating means.

12. A method of generating a high power oscillating signal within a single device comprising the steps of:

generating a plurality of resonating currents within a plurality of active devices;

coupling said plurality of resonating currents to a plurality of transmission lines;

creating a high impedance to said plurality of transmission lines from a temperature compensated source when said plurality of resonating currents are at a determined resonant frequency;

removing said high impedance from said plurality of transmission lines when said plurality of resonating currents are not at said resonant frequency to allow said plurality of resonating currents to be transmitted to a source of electrical ground;

transmitting said plurality of resonating currents to a plurality of parallel, non-contacting output transmission lines, at least one each of said plurality of resonating currents electromagnetically transmitted to one each of said plurality of output transmission lines;

generating resonating high impedances corresponding to said electromagnetically transmitted resonating currents at outputs of said plurality of output transmission lines;

impedance matching said resonating high impedances of said plurality of output transmission lines and combining the outputs of said plurality of output transmission lines to generate a high power output; and outputting said high power output.

13. A method according to claim 12 wherein said method further comprises:

coupling said plurality of output transmission lines to an electric ground; and coupling said plurality of transmission lines to a high Q tank circuit.

* * * * *